US012811554B2

(12) United States Patent
Liwinski

(10) Patent No.: US 12,811,554 B2
(45) Date of Patent: Nov. 24, 2026

(54) DYNAMIC BIAS FOR DOHERTY PA

(71) Applicant: Huawei Technologies Co., Ltd., Shenzhen (CN)

(72) Inventor: Henry Z. Liwinski, North Wales, PA (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 629 days.

(21) Appl. No.: 18/344,463

(22) Filed: Jun. 29, 2023

(65) Prior Publication Data

US 2023/0344397 A1 Oct. 26, 2023

Related U.S. Application Data

(63) Continuation of application No. PCT/US2020/067718, filed on Dec. 31, 2020.

(51) Int. Cl.

*H03G 3/30* (2006.01)
*H03F 1/02* (2006.01)
*H03F 3/24* (2006.01)

(52) U.S. Cl.

CPC ......... *H03G 3/3042* (2013.01); *H03F 1/0288* (2013.01); *H03F 3/245* (2013.01); *H03F 2200/451* (2013.01)

(58) Field of Classification Search

CPC ..... H03G 3/3042; H03F 1/0288; H03F 3/245; H03F 2200/451
USPC .......................................................... 330/195
See application file for complete search history.

(56) References Cited

U.S. PATENT DOCUMENTS 7,053,706 B2 * 5/2006 Kwon .................... H03F 1/0205 330/84
2004/0174212 A1 * 9/2004 Kim ...................... H03F 1/0288 330/124 R
2006/0017509 A1 * 1/2006 Veitschegger ............ H03F 1/30 330/285
2007/0052479 A1 * 3/2007 Wang ...................... H03F 3/195 330/285
2018/0026594 A1 * 1/2018 Lehtola ................... H03F 3/211 455/571

(Continued)

FOREIGN PATENT DOCUMENTS

CN 101002379 A * 7/2007
CN 113422579 A * 9/2021 ........... H03F 1/0288

OTHER PUBLICATIONS

Lee, Yong-Sub et al; "Highly linear and efficient Doherty amplifier employing power tracking bias supply cheme for WCDMA applications", 2008 IEEE Radio and Wireless Symposium, Jan. 22-24, 2008, 4 pages.

(Continued)

*Primary Examiner* — Hafizur Rahman
(74) *Attorney, Agent, or Firm* — Slater Matsil, LLP

(57) ABSTRACT

A circuit includes a Doherty power amplifier circuit configured to amplify an input signal and generate an amplified signal of the input signal. The Doherty power amplifier circuit includes a first power amplifier circuit configured to operate in class C. The circuit further includes a bias circuit electrically coupled to the first power amplifier circuit. The bias circuit is configured to generate a bias based on the input signal, and to bias the first power amplifier circuit using the generated bias.

16 Claims, 6 Drawing Sheets

(56) References Cited

U.S. PATENT DOCUMENTS

2019/0068129 A1* 2/2019 Ito .......................... H03F 3/191

OTHER PUBLICATIONS

Tabarani, F. et al.; "Power-efficient full-duplex K/Ka-band phased array front-end", IET Microwaves, Antennas & Propagation, The Institution of Engineering and Technoloy, May 21, 2019, 13 pages.

* cited by examiner

DYNAMIC BIAS FOR DOHERTY PA

CROSS-REFERENCE TO RELATED APPLICATIONS

This application is a continuation of International Application No. PCT/US2020/067718, filed Dec. 31, 2020, and entitled "Dynamic Bias for Doherty PA," application of which is hereby incorporated herein by reference in its entirety.

TECHNICAL FIELD

The present disclosure relates generally to power amplification, and in particular embodiments, to techniques and mechanisms of dynamic bias for a Doherty power amplifier.

BACKGROUND

Power amplifiers (PAs) for converting low-power signals to higher-power signals have been widely used in various fields, such as wireless communications. For example, an application of a PA in wireless communications is to generate a higher-power radio frequency (RF) signal for driving an antenna of a transmitter, e.g., at a base station or a user equipment. PA design objectives may include optimizing certain performance parameters, such as gains, power outputs, bandwidths, power efficiencies and linearity.

In modern wireless communications systems and networks, e.g., 5th generation (5G) or above systems, advanced modulation schemes are used for high spectrum efficiency, and RF signals in this case may exhibit a large peak to average power ratio (PAPR). This causes a large variation in the instantaneous output power. Conventional RF PA, when used to amplify such RF signals, would suffer from rather low average efficiency with high PAPR stimulus. Doherty amplifier has been noticed to be able to accommodate large PAPR, thus improving amplification efficiency. It has found increasing use in the wireless communications field and other applicable fields.

SUMMARY

Technical advantages are generally achieved, by embodiments of this disclosure which describe dynamic bias for a Doherty amplifier.

In accordance with one aspect of the present disclosure, a circuit is provided that includes: a power amplifier circuit configured to amplify a first input signal and generate an amplified signal of the first input signal, the power amplifier circuit comprising a first power amplifier circuit configured to operate in class C; and a bias circuit electrically coupled to the first power amplifier circuit, the bias circuit configured to generate a bias based on a control signal to bias the first power amplifier circuit, with the control signal based on the first input signal.

Optionally, in any of the preceding aspects, the bias circuit is configured to generate the bias based on power of the first input signal.

Optionally, in any of the preceding aspects, the power amplifier circuit is a Doherty power amplifier.

Optionally, in any of the preceding aspects, the bias circuit is configured to receive the control signal that is a function of the first input signal, and to generate the bias based on the control signal.

Optionally, in any of the preceding aspects, the bias circuit comprises a first transistor, the first transistor comprising: an emitter electrically coupled to the first power amplifier circuit, with the bias being output at the emitter; a collector electrically coupled to a first power supply; and a base electrically coupled to the control signal.

Optionally, in any of the preceding aspects, the bias circuit further comprises: a first capacitor electrically connected between the base of the first transistor and a ground; a first resistor electrically connected between the base of the first transistor and a second power supply, a second transistor, comprising an emitter electrically connected to the ground through a second resistor, a collector electrically connected to the base of the first transistor, and a base electrically connected to the ground through a second capacitor; and a first diode electrically connected between the base of the second transistor and the control signal.

Optionally, in any of the preceding aspects, the bias circuit further comprises: a third resistor electrically connected in series with a fourth resistor at a first terminal of the third resistor and between the second power supply and a collector of a third transistor, wherein the first diode is electrically connected between the base of the second transistor and the first terminal of the third resistor; and the third transistor, comprising an emitter electrically coupled to the first input signal, and a base electrically connected to the ground via a third capacitor.

Optionally, in any of the preceding aspects, the bias circuit further comprises: a fifth resistor, a second diode and a third diode connected in series, the fifth resistor having a first terminal connected to the second power supply, and having a second terminal connected to an anode of the second diode and to the base of the third transistor; and the third diode having a cathode connected to the ground.

Optionally, in any of the preceding aspects, the power amplifier circuit further comprises a second power amplifier circuit configured to operate in class AB, and wherein the first power amplifier circuit is configured to receive the first input signal and generate a first amplified signal of the first input signal, and the second power amplifier circuit is configured to receive the first input signal and generate a second amplified signal of the first input signal.

Optionally, in any of the preceding aspects, the circuit further comprises a combiner circuit configured to combine the first amplified signal of the first input signal and the second amplified signal of the first input signal to obtain the amplified signal of the first input signal.

In accordance with another aspect of the present disclosure, a circuit is provided that includes: a Doherty power amplifier circuit configured to amplify a first input signal and generate an amplified signal of the first input signal, the Doherty power amplifier circuit comprising a first power amplifier circuit configured to operate in class C; and a bias circuit electrically coupled to the first power amplifier circuit, the bias circuit configured to generate a bias based on the first input signal to bias the first power amplifier circuit.

Optionally, in any of the preceding aspects, the bias circuit is configured to generate the bias based on power of the first input signal.

Optionally, in any of the preceding aspects, the bias is a current bias or a voltage bias.

Optionally, in any of the preceding aspects, the bias circuit is configured to receive a second signal that is a function of the first input signal, and to generate the bias based on the second signal.

Optionally, in any of the preceding aspects, the bias circuit comprises a first transistor, the first transistor comprising: an emitter electrically coupled to the first power amplifier circuit, with the bias being output at the emitter; a collector electrically coupled to a first power supply; and a base electrically coupled to the second signal.

Optionally, in any of the preceding aspects, the bias circuit further comprises: a first capacitor electrically connected between the base of the first transistor and a ground; a first resistor electrically connected between the base of the first transistor and a second power supply; a second transistor, comprising an emitter electrically connected to the ground through a second resistor, a collector electrically connected to the base of the first transistor, and a base electrically connected to the ground through a second capacitor; and a first diode electrically connected between the base of the second transistor and the second signal.

Optionally, in any of the preceding aspects, the bias circuit further comprises: a third resistor electrically connected in series with a fourth resistor at a first terminal of the third resistor and between the second power supply and a collector of a third transistor, wherein the first diode is electrically connected between the base of the second transistor and the first terminal of the third resistor; and the third transistor, comprising an emitter electrically coupled to the first input signal, and a base electrically connected to the ground via a third capacitor.

Optionally, in any of the preceding aspects, the bias circuit further comprises: a fifth resistor, a second diode and a third diode connected in series, the fifth resistor having a first terminal connected to the second power supply, and having a second terminal connected to an anode of the second diode and to the base of the third transistor; and the third diode having a cathode connected to the ground.

Optionally, in any of the preceding aspects, the Doherty power amplifier circuit further comprises a second power amplifier circuit configured to operate in class AB, and wherein the first power amplifier circuit is configured to receive the first input signal and generate a first amplified signal of the first input signal, and the second power amplifier circuit is configured to receive the first input signal and generate a second amplified signal of the first input signal.

Optionally, in any of the preceding aspects, the circuit further comprises a combiner circuit configured to combine the first amplified signal of the first input signal and the second amplified signal of the first input signal to obtain the amplified signal of the first input signal.

In accordance with another aspect of the present disclosure, a method is provided that includes: amplifying a first input signal by a power amplifier circuit, the power amplifier circuit comprising a first power amplifier circuit configured to operate in class C; and biasing the first power amplifier circuit based on a control signal that is based on the first input signal.

Optionally, in any of the preceding aspects, the method further includes generating a bias based on the control signal to bias the first power amplifier circuit.

Optionally, in any of the preceding aspects, the method further includes obtaining an amplified signal of the first input signal.

Optionally, in any of the preceding aspects, the method further includes generating the control signal based on the first input signal.

Optionally, in any of the preceding aspects, the first power amplifier circuit is biased using a bias circuit electrically coupled to the first power amplifier circuit.

The above aspects have advantages of providing enhanced efficiency over a large dynamic range of output power, improved linearity, and extended 1 dB compression point to a power amplifier circuit, e.g., a Doherty power amplifier.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Conventionally, a Doherty power amplifier (PA) uses a fixed bias to bias a peaking PA of the Doherty PA. Embodiments of the present disclosure provide a biasing scheme for dynamically biasing a peaking PA of a Doherty PA. In particular, the peaking PA is biased using a bias that is generated based on generally a signal input to the Doherty PA. In one example, the signal at the Doherty PA input may directly relate to a transmitter modulated signal. The peaking PA of the Doherty amplifier may also be biased based on the transmitter modulated signal. The embodiments enable to enhance efficiency of the Doherty PA over a large dynamic range of output signal power, improve linearity, and extend the 1 dB compression point of the Doherty PA.

The embodiment biasing scheme may be applied to a Doherty PA and any other applicable power amplifier. In some embodiments, a circuit is provided that includes a Doherty PA circuit configured to amplify an input signal and generate an amplified signal of the input signal. The Doherty PA circuit includes a first power amplifier circuit configured to operate in class C. The circuit further includes a bias circuit electrically coupled to the first power amplifier circuit. The bias circuit is configured to generate a bias based on the input signal, and to bias the first power amplifier circuit using the generated bias. The embodiments will be provided in more details in the following.

Figure 1:
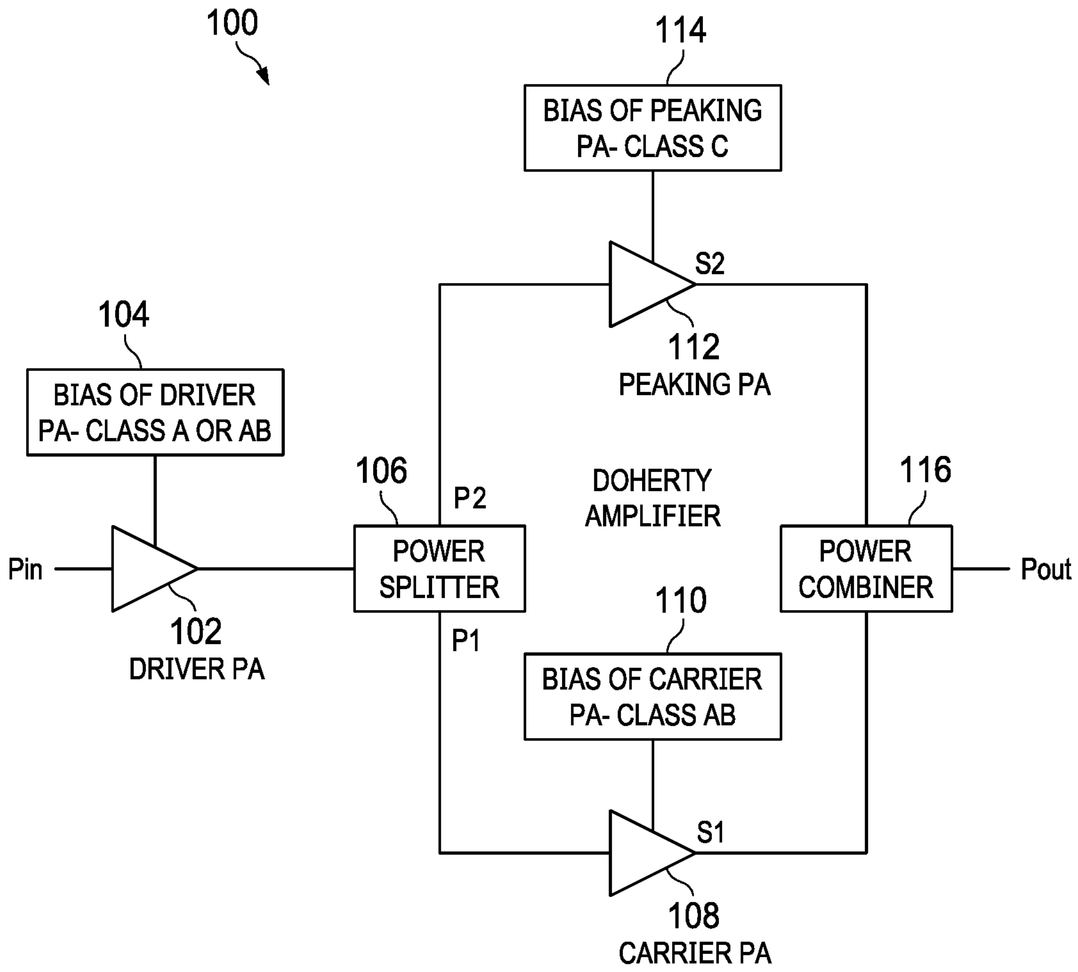
FIG. 1 (PRIOR ART)
FIG. 1 illustrates a schematic diagram of a conventional Doherty amplifier.

FIG. 1 illustrates a conventional Doherty amplifier (or power amplifier) 100. In the present disclosure, the terms of "power amplifier", "PA" and "amplifier" are used interchangeably. The form, dimension and circuit of a Doherty power amplifier circuit may vary for different applications. As shown in the example of FIG. 1, the Doherty amplifier 100 includes a driver PA 102, a bias circuit 104 for biasing the driver PA 102, a power splitter 106 electrically coupled to the driver PA 102, a carrier PA (also referred to as a main PA) 108, a bias circuit no for biasing the carrier PA 108, a peaking PA (also referred to as an auxiliary PA) 112, a bias circuit 114 for biasing the peaking PA 112, and a power combiner 116. Each of the carrier PA 108 and the peaking PA 112 is electrically coupled between the power splitter 106 and the power combiner 116.

The driver PA 102 receives an input signal (represented as Pin) that is to be amplified by the Doherty amplifier 100, amplifies the signal Pin, and outputs an amplified signal to the power splitter 106. The bias circuit 104 generates a bias (which may be a current or a voltage) to bias the driver PA 102, and the driver PA 102 may be biased to operate in class AB. The driver PA 102 may be a current amplifier or a voltage amplifier.

The power splitter 106 receives the amplified signal from the driver PA 102, and directs the amplified signal onto two different paths: a main path and an auxiliary path. On the main path, an output signal P1 of the power splitter 106 is directed to the carrier PA 108. On the auxiliary path, an output signal P2 of power splitter 106 is directed to the peaking PA 112.

The carrier PA 108 is biased, by the bias circuit 110, to operate in class AB. The peaking PA 112 is biased, by the bias circuit 114, to operate in class C. The carrier PA 108 and the peaking PA 112 each may include a transistor. The carrier PA 108 and/or the peaking PA 112 may be configured using any transistor technologies. For example, they may use bipolar transistors, e.g., heterojunction bipolar transistors (HBTs), field effect transistors (FETs), e.g., Metal-oxide-semiconductor Field-Effect Transistors (MOSFETs), etc.

The carrier PA 108 amplifies the input signal P1 and outputs a signal S1. The peaking PA 112 amplifies the input signal P2 and outputs a signal S2. The power combiner 116 combines the signals S1 and S2 and generates an output signal Pout, which may be referred to as an amplified signal of the input signal Pin by the Doherty amplifier 100.

Generally, the conventional Doherty amplifier 100 is designed such that the peaking PA 112 is in a normally-off state before the carrier PA 108 starts to compress. Thus, before the carrier PA 108 starts to compress, Pout may only include S1, and there is no S2 generated. When the carrier PA 108 starts to compress, the peaking PA 112 starts turning on. In this case, both the carrier PA 108 and the peaking PA 112 are working, and S1 and S2 are combined, e.g., added, and output as Pout.

Figure 2:
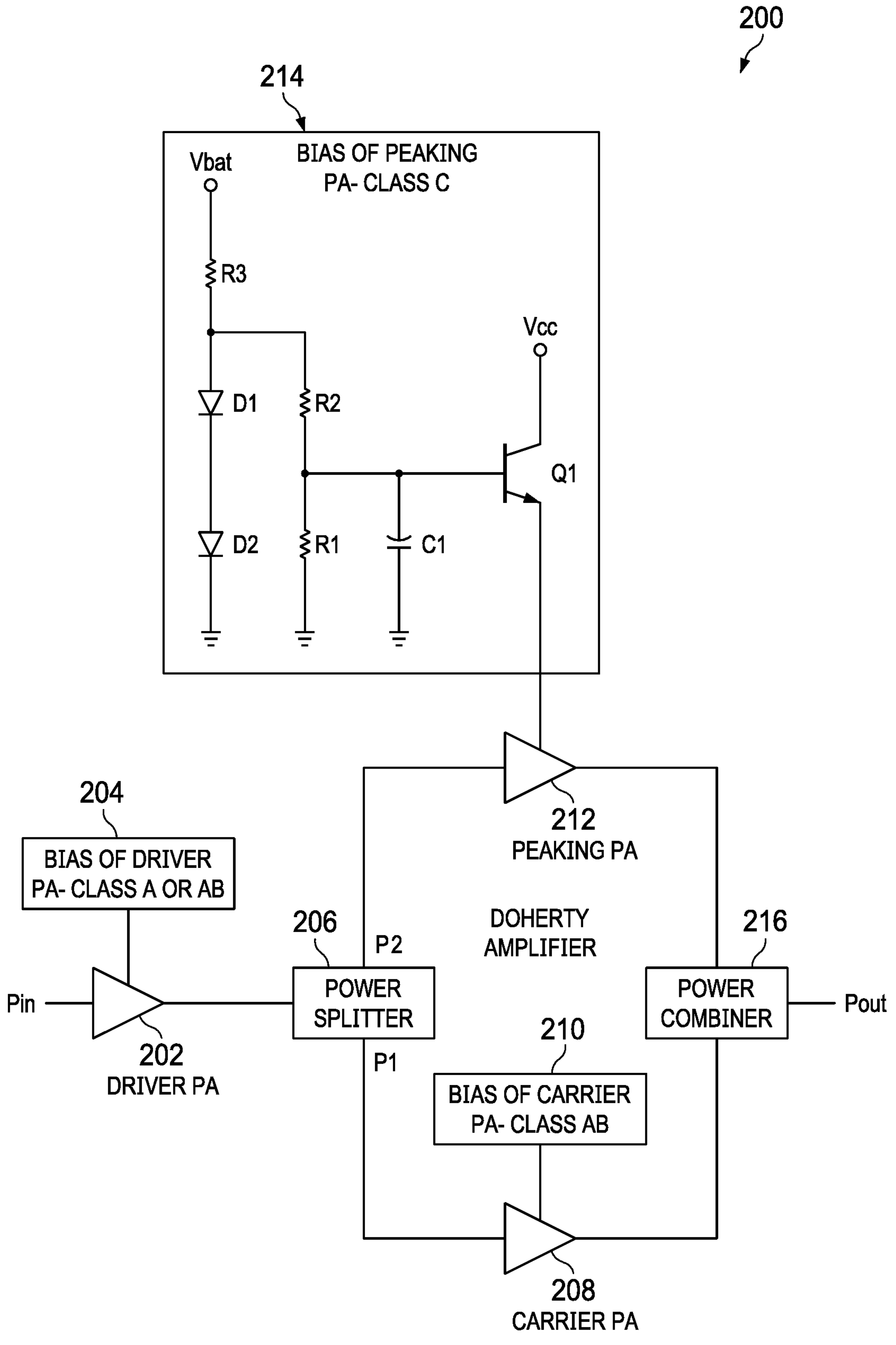
FIG. 2 illustrates a schematic diagram of a bias circuit for biasing a peaking power amplifier (PA) of the Doherty amplifier in FIG. 1.

FIG. 2 illustrates a schematic diagram of an example bias circuit for biasing the peaking PA of the Doherty amplifier in FIG. 1. For illustration convenience, the Doherty amplifier 100 is renumbered as a Doherty amplifier 200 in FIG. 2, with its components renumbered as well. As shown, the Doherty amplifier 200 includes a driver PA 202, a bias circuit 204 for biasing the driver PA 202, a power splitter 206, a carrier PA 208, a bias circuit 210 for biasing the carrier PA 208, a peaking PA 212, a bias circuit 214 for biasing the peaking PA 212, and a power combiner 216. These components are similar to the corresponding components as illustrated in FIG. 1.

Specifically, FIG. 2 illustrates an example of the bias circuit 214, which generates a constant bias for biasing the peaking amplifier 212. As shown, the bias circuit 214 includes a transistor Q1. The collector (also referred to as the collector terminal) of the transistor Q1 is electrically coupled to a power supply Vcc. The emitter (also referred to as the emitter terminal) of the transistor Q1 is electrically coupled to the peaking PA 212. The bias circuit 214 generates a bias at the emitter to bias the peaking PA 212. The base (also referred to as the base terminal) of the transistor Q1 is electrically coupled to a ground via a capacitor C1. The base of the transistor Q1 is also electrically coupled to the ground via a resistor R1. The base of the transistor Q1 is further electrically coupled to a regulated power supply, e.g., a battery voltage Vbat, via resistors R2 and R3. The resistors R2 and R3 are connected in series. The connecting node of R2 and R3 is electrically coupled to the anode of a diode D1. The cathode of the diode D1 is connected to the anode of a diode D2. The cathode of the diode D2 is connected to the ground. The bias circuit 214 merely shows an example circuit for biasing the peaking PA with a constant bias, and other applicable circuits may also be used.

Embodiments of the present disclosure provide a biasing scheme for dynamically biasing a peaking PA of a Doherty amplifier. In particular, the peaking PA is biased using a bias that is generated based on the input signal to the Doherty amplifier. For example, the input signal at the Doherty PA may relate to a transmitter modulated signal. It is also possible that the peaking PA of the Doherty amplifier is biased based on the transmitter modulated signal. The peaking PA may thus be adaptively turned off as the input power level varies. The embodiment biasing scheme may be applied to a Doherty amplifier and any other applicable power amplifiers. The embodiments have advantages of, e.g., being able to keep the peaking PA of the Doherty amplifier deeply off at low output power levels (by delivering no bias current to the peaking PA, and preventing it from early self-biasing), and slightly on at high output power levels by delivering very small bias current to the Doherty amplifier. The embodiments enable the Doherty PA to enhance efficiency over a large dynamic range of output power, improve linearity, and extend 1 dB compression.

Figure 3:
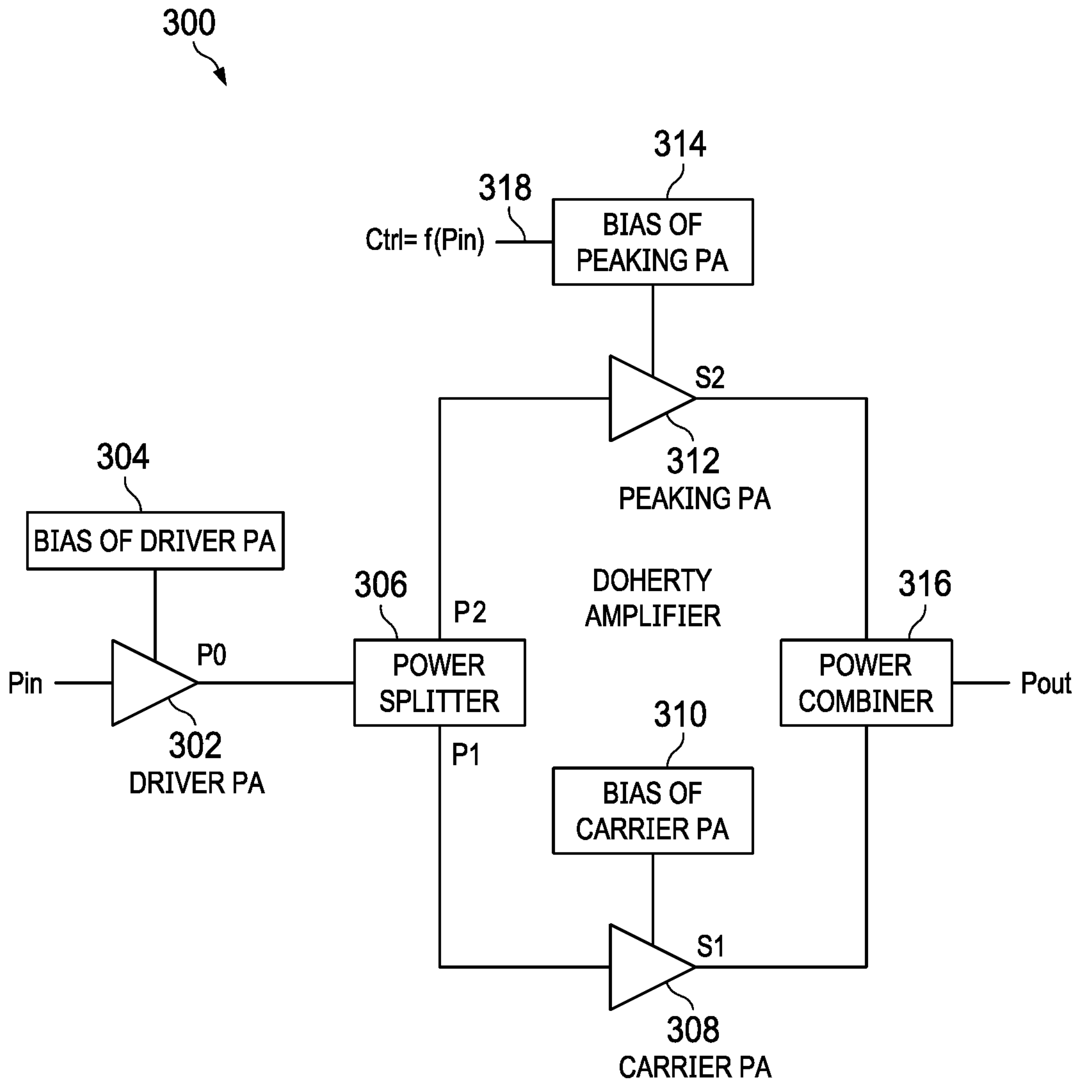
FIG. 3 illustrates a schematic diagram of an embodiment Doherty amplifier.

FIG. 3 illustrates a schematic diagram of an embodiment Doherty amplifier 300, where a peaking PA is dynamically biased based on an input signal of the Doherty amplifier 300. As shown, the Doherty amplifier 300 includes a driver PA 302, a bias circuit 304 for biasing the driver PA 302, a power splitter 306, a carrier PA 308 biased to operate in class AB, a bias circuit 310 for biasing the carrier PA 308, a peaking PA 312 biased to operate in class C, and a power combiner 316. These components are similar to the corresponding components as illustrated in FIG. 1. Generally, an input signal Pin to be amplified by the Doherty amplifier 300 is received and amplified by the driver PA 302, which generates a signal P0. The power splitter 306 receives the signal P0 as an input, directs an output signal P1 to the carrier PA 308 and directs an output signal P2 to the peaking PA 312. The carrier PA 308 receives and amplifies P1 to generate a signal S1. The peaking PA 312 receives and amplifies P2 to generate a signal S2. S1 and S2 are then combined by the power combiner 316 to generate an output signal Pout of the Doherty amplifier 300.

The carrier PA 308 and the peaking PA 312 each may be designed with the same technology or different technologies. The peaking PA 312 is biased by a bias circuit 314. The bias circuit 314 receives a control signal 318 and generates a bias based on the control signal 318 to bias the peaking PA 312. The control signal 318 may be configured such that the peaking PA 312 is generally in an off-state when the carrier PA 308 is not compressing, and is turning on when the carrier PA 308 starts to compress. In some embodiments, the control signal 318 may be generated based on the input signal Pin or other signal that relates to Pin, e.g., a signal from a transmitter (an example will be given in FIG. 6). As a result, the bias generated by the bias circuit 314 based on the control signal may vary with the input signal Pin. In an example, the control signal 318 may be configured as a function of the input signal Pin, represented as, e.g., Ctrl=f (Pin), where "Ctrl" represents the control signal, "f( )" represents the function, and "Pin" is the input signal. For example, the control signal 318 may be a function of power of the input signal Pin, and the bias generated by the bias circuit 314 is therefore based on the power of the input signal Pin. The peaking PA 312 is thus able to be dynamically biased as the input signal power varies. The function may be configurable based on various factors or considerations, such as a circuit design objectives and/or constraints, hardware dimensions, application of the Doherty amplifier, power ranges of output signals, etc. The function may be in a form of hardware, software, firmware or a combination thereof.

The bias circuit 314 may be implemented with the Doherty amplifier 300 in an integrated manner, or as a separate circuit. The bias circuit 314 may generate the bias as a current or a voltage. The control signal 318 may be generated, through software, hardware, firmware, or a combination thereof, based on the input signal Pin or another signal that is directly related to Pin. Those of ordinary skill in the art would recognize that the bias circuit 314 may have various forms and structures without departing from the principle of the present disclosure.

Figure 4:
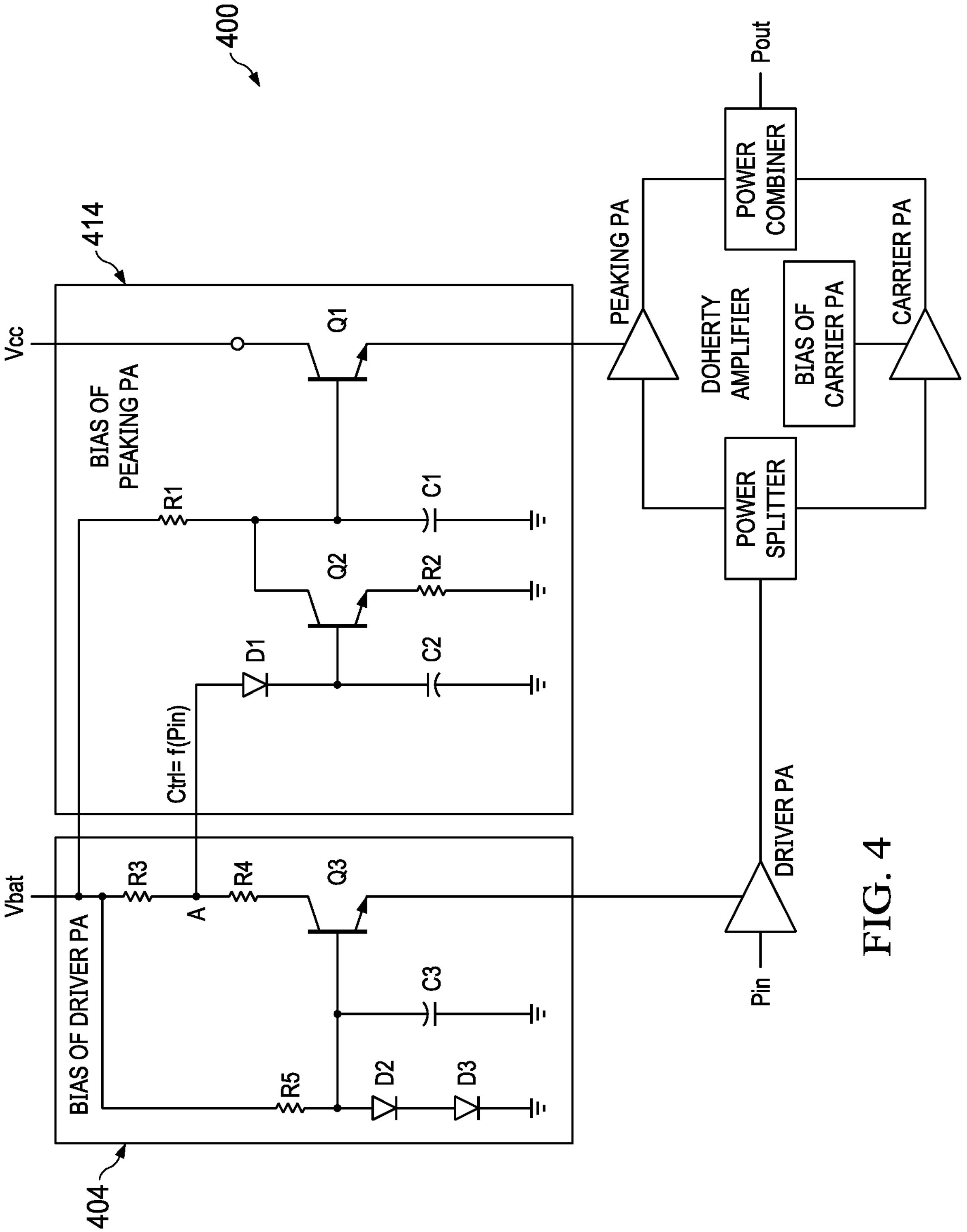
FIG. 4 illustrates a schematic diagram of an embodiment bias circuit for biasing a peaking PA of the Doherty amplifier in FIG. 3.

FIG. 4 is a schematic diagram illustrating an embodiment bias circuit for biasing the peaking PA of the Doherty amplifier 300 illustrated in FIG. 3. For illustration convenience, the Doherty amplifier 300 is renumbered as a Doherty amplifier 400 in FIG. 4. The Doherty amplifier 400 is similar to the Doherty amplifier 300 as illustrated in FIG. 3 and details are thus not repeated.

Specifically, FIG. 4 illustrates a bias circuit 414 as an example of the bias circuit 314 in FIG. 300. The bias circuit 414 is configured to provide, to the peaking PA of the Doherty amplifier 400, a bias that is generated based on an input signal Pin of the Doherty amplifier 400, as discussed above with respect to FIG. 3. The bias circuit 414 is merely provided as an example. Those of ordinary skill in the art would recognize that other variations, alternatives and modifications of the bias circuit 414 may also be applicable.

As shown in FIG. 4, the bias circuit 414 includes a transistor Q1. The transistor Q1 has a collector electrically coupled to a power supply Vcc, an emitter electrically coupled to the peaking PA of the Doherty amplifier 400, and a base electrically coupled to a ground via a capacitor C1. The base of the transistor Q1 is also electrically coupled to a power supply Vbat via a resistor R1. The base of the transistor Q1 is further electrically coupled to a collector of a transistor Q2. The transistor Q2 has an emitter electrically coupled to the ground via a resistor R2, and a base electrically coupled to the ground via a capacitor C2. The base of the transistor Q2 is also electrically coupled to the cathode of a diode D1, and the anode of the diode D1 is electrically coupled to a connecting node A of resistors R3 and R4. Resistors R3 and R4 are connected in series between the power supply Vbat and a collector of a transistor Q3. The transistor Q3 has a base electrically coupled to the ground through a capacitor C3, and an emitter electrically coupled to a driver PA of the Doherty amplifier 400. The base of the transistor Q3 is also electrically coupled to the anode of a diode D2. Resistor R5, the diode D2 and a diode D3 are connected in series between the power supply Vbat and the ground. The cathode of diode D3 is electrically connected to the ground, and the resistor R5 has one terminal electrically connected to Vbat. The transistors Q1, Q2 and Q3 may be implemented using the same transistor technology or different transistor technologies.

The transistor Q3, resistor R5, capacitor C3 and diodes D2 and D3 may form a bias circuit 404 for biasing the driver PA of the Doherty amplifier 400. In an example, the resistors R3 and R4 may also be part of the bias circuit 404. In another example, the resistors R3 and R4 may not be needed for biasing the driver PA. A bias may be supplied to the driver PA at the emitter of the transistor Q3. The driver PA may be biased to operate in class AB in this example.

In this example, the signal at the anode of the diode D1 may be viewed as the control signal as discussed with respect to FIG. 3. The control signal may vary with the input signal Pin, and in this example, the power of the input signal Pin. The bias is applied to the peaking PA at the emitter of the transistor Q1, and may change as the control signal changes, and consequently, as the input signal power of the Doherty amplifier 400 changes.

As the Doherty amplifier 400 receives the input signal, when the input signal power to the Doherty amplifier 400 is low, the voltage at the anode of diode D1 is high enough such that the transistor Q2 is saturated, and the transistor Q1 is turned off. In this case, there is no bias current flowing to the peaking PA, and thus the peaking PA is turned off. As the input signal power increases, the current at the collector of the transistor Q3 increases, which lowers the voltage applied to the diode D1, and at a certain point, the voltage at the base of Q1 starts increasing. When the voltage at the base of Q1 reaches a first voltage level (which is based on the technology used to implement Q1), i.e., the input signal power reaches a first power level, Q1 is starting getting very small current through R1 to its base. In this case, a very small biasing current is flowing through Q1, and the peaking PA thus becomes slightly active. As used herein, "slightly active" means that the peaking PA starts operating and producing a smaller gain compared with what is obtained when it is operating at self-biasing input power levels (which is referred to as fully active). As the input signal power increases beyond the first power level, the current flowing to the base of Q1 increases, and thus the biasing current flowing through Q1 to the peaking PA increases, where the increasing biasing current causes the peaking PA to produce increasing gain. When the input signal power reaches a second power level (higher than the first power level), the voltage applied to the diode D1 is lowered to a certain level such that Q2 is turned off, and the voltage at the base of Q1 reaches a second voltage level (which is based on the technology used to implement Q1), in which case, Q1 starts to supply a constant biasing current to the peaking PA. The biasing current to the peaking PA will generally stay constant for input power levels higher than the second power level. Thus, with the bias to the peaking PA generated based on the input signal, when the input signal power reaches the first power level the peaking PA starts operating and producing a certain gain. This is different from the conventional fixed biasing scheme, where the peaking PA starts operating only when the input signal power reaches a self-biasing level (i.e., the input signal power level is high enough to turn the peaking PA on) and there is no biasing current applied to the peaking PA. The embodiment thus increases the gain of the peaking PA at a certain input power level, and consequently, increases the gain of the Doherty PA.

The embodiment circuits, e.g., the biasing circuit for the peaking PA, may include field-programmable gate arrays (FPGAs), application specific integrated circuits (ASICs), radio-frequency integrated circuits (RFICs) and combinations of various hardware and logic circuitry for performing at least the functions described herein.

Figure 5:
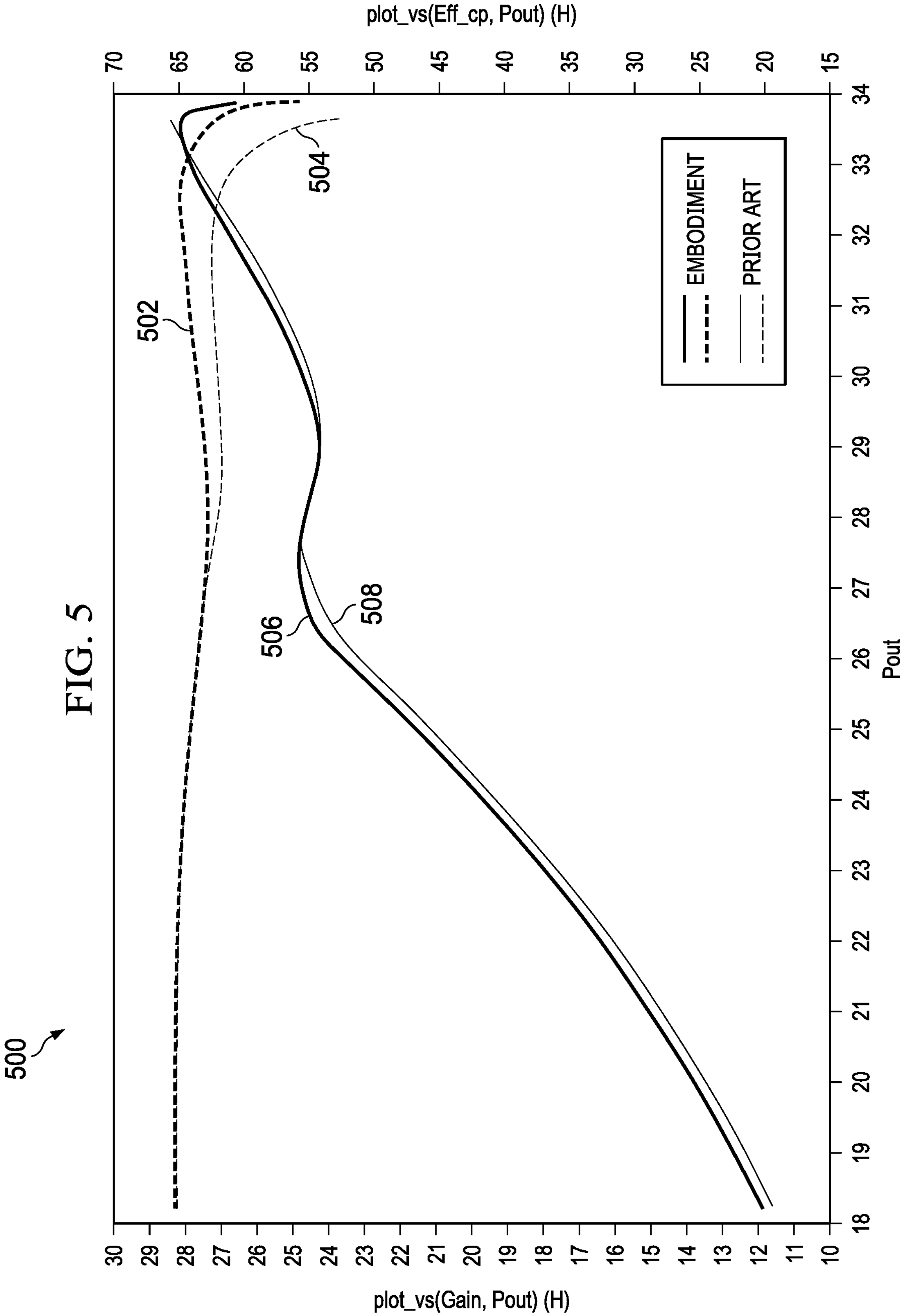
FIG. 5 illustrates a graph showing gains and efficiencies with respect to output power of a Doherty amplifier biased conventional and according to an embodiment of the present disclosure.

FIG. 5 illustrates a graph showing gains and efficiencies with respect to output power of a Doherty amplifier, in cases where the peaking PA is biased conventionally and according to the embodiment of the present disclosure, respectively. The x axis represents the output power of the Doherty amplifier (in dBm). They axis on the left represents power gain of the Doherty amplifier (in dB), and they axis on the right represents efficiency of the Doherty amplifier (in %).

Curve 502 shows gains obtained by the Doherty amplifier with the peaking PA of the Doherty amplifier biased according to the embodiment as discussed above with respect to FIGS. 3 and 4, i.e., biased dynamically based on power of an input signal to be amplified by the Doherty amplifier. Curve 504 shows gains obtained by the Doherty amplifier with the peaking PA of the Doherty amplifier biased conventionally, i.e., using a constant bias. As seen, the curve 502, compared with the curve 504, exhibits a significant increase of gain as the output power increases. Curve 5o6 shows efficiencies obtained by the Doherty amplifier with the peaking PA of the Doherty amplifier biased according to the embodiment as discussed above with respect to FIGS. 3 and 4. Curve 508 shows efficiencies obtained by the Doherty amplifier with the peaking PA of the Doherty amplifier biased conventionally. As seen, the curve 506 exhibits an increase of efficiency compared with the curve 508. It can be seen from FIG. 5 that the embodiment biasing scheme improves the gain and efficiency of the Doherty amplifier compared with the conventional constant biasing scheme.

Figure 6:
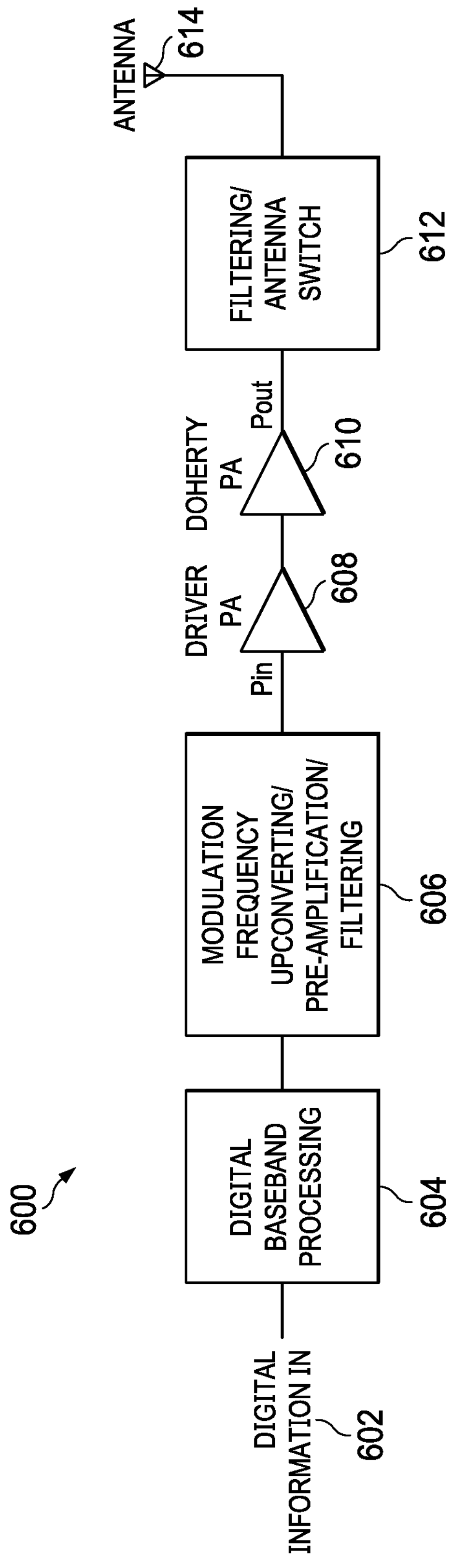
FIG. 6 illustrates a block diagram of an embodiment electronic device.

FIG. 6 illustrates a schematic diagram of an example transmitter device 600, where the embodiments of the present disclosure may be applied. FIG. 6 merely illustrates an example transmitter device. Those of ordinary skill in the art would recognize that the transmitter device 600 may have various forms and structures, and other variations, alternatives and modifications of the transmitter device 600 may apply. Digital information 602, such as data to be transmitted by the transmitter device 600, is received by a digital baseband processing block 604, which processes the digital information 602 at baseband, and outputs a processed baseband signal. The processed baseband signal is received by a modulation block 606, which modulates the processed baseband signal onto a frequency that is suitable for transmission, to generate a frequency modulated signal. The modulation block 606 may also perform pre-amplification filtering on the frequency modulated signal to generate a pre-amplified signal Pin. The signal Pin may be similar to the Pin illustrated in FIGS. 3-4. The signal Pin is then sent to a drive PA 608, and then to a Doherty PA 610 for amplification. The drive PA 608 may be similar to the driver PA 302 as illustrated in FIG. 3. The Doherty PA 610 may include a peaking PA that is biased based on the Pin, or based on the frequency modulated signal instead of the Pin. A filtering/antenna switch 612 may perform filtering on the output Pout of the Doherty PA 610, and directs a filtered signal to an antenna 614 for transmission.

Figure 7:
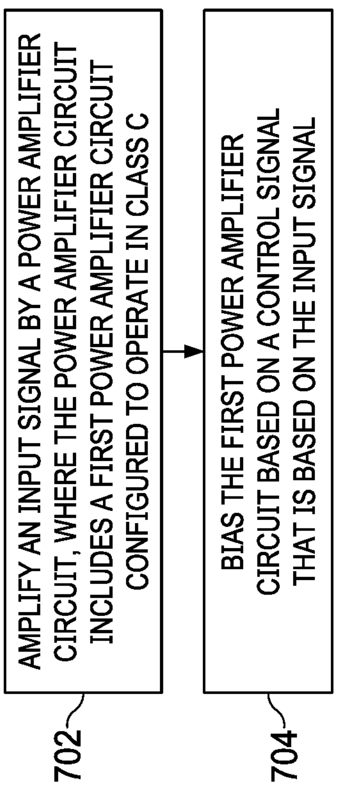
FIG. 7 illustrates a flow chart of an embodiment method for amplifying a signal.

FIG. 7 illustrates a flow chart of an embodiment method 700 for amplifying a signal. As shown, the method 700 includes amplifying an input signal by a power amplifier circuit (block 702). The power amplifier circuit includes a first power amplifier circuit configured to operate in class C. The method 700 further includes biasing the first power amplifier circuit based on a control signal that is based on the input signal (block 704). The method 700 may further include generating a bias based on the control signal to bias the first power amplifier circuit. The method 700 may also include generating the control signal based on the first input signal. The first power amplifier circuit may be biased using the bias circuit 414 as illustrated in FIG. 4.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A circuit comprising:

a Doherty power amplifier circuit configured to amplify a first input signal and to generate an amplified signal of the first input signal, the Doherty power amplifier circuit comprising a first power amplifier circuit configured to operate in class C; and a bias circuit external to and electrically coupled to the first power amplifier circuit, the bias circuit configured to:

receive a control signal, the control signal being derived from the first input signal; and generate a dynamic bias to bias the first power amplifier circuit, the dynamic bias being adjustable based on the control signal;

wherein the bias circuit comprises a first transistor, the first transistor comprising:

a first emitter electrically coupled to the first power amplifier circuit, with the dynamic bias being output at the first emitter, a first collector electrically coupled to a first power supply, and a first base electrically coupled to the control signal; and wherein the bias circuit further comprises:

a first capacitor electrically connected between the first base of the first transistor and a ground, a first resistor electrically connected between the first base of the first transistor and a second power supply different from the first power supply, a second transistor, comprising a second emitter electrically connected to the ground through a second resistor, a second collector electrically connected to the first base of the first transistor, and a second base electrically connected to the ground through a second capacitor different from the first capacitor, and a first diode electrically connected between the second base of the second transistor and the control signal.

2. The circuit of claim 1, wherein the bias circuit is configured to generate the dynamic bias based on power of the first input signal.

3. The circuit of claim 1, wherein the bias circuit is configured to receive the control signal that is a function of the first input signal, and to generate the dynamic bias based on the control signal.

4. The circuit of claim 1, wherein the Doherty power amplifier circuit further comprises a second power amplifier circuit configured to operate in class AB, and wherein the first power amplifier circuit is configured to receive the first input signal and generate a first amplified signal of the first input signal, and the second power amplifier circuit is configured to receive the first input signal and generate a second amplified signal of the first input signal.

5. The circuit of claim 4, wherein the circuit further comprises a combiner circuit configured to combine the first amplified signal of the first input signal and the second amplified signal of the first input signal to obtain the amplified signal of the first input signal.

6. The circuit of claim 1, wherein the bias circuit further comprises:

a third resistor electrically connected in series with a fourth resistor at a first terminal of the third resistor and between the second power supply and a third collector of a third transistor, wherein the first diode is electrically connected between the second base of the second transistor and the first terminal of the third resistor; and the third transistor, comprising a third emitter electrically coupled to the first input signal, and a third base electrically connected to the ground via a third capacitor.

7. The circuit of claim 6, wherein the bias circuit further comprises:

a fifth resistor, a second diode and a third diode connected in series, the fifth resistor including a second terminal connected to the second power supply and a third terminal connected to an anode of the second diode and to the third base of the third transistor; and the third diode including a cathode connected to the ground.

8. A circuit comprising:

a Doherty power amplifier circuit configured to amplify a first input signal and generate an amplified signal of the first input signal, the Doherty power amplifier circuit comprising a first power amplifier circuit configured to operate in class C; and a bias circuit electrically coupled to the first power amplifier circuit, the bias circuit configured to:

receive a second signal that is a function of the first input signal; and generate a dynamic bias based on the second signal to bias the first power amplifier circuit, the dynamic bias being adjustable, wherein the bias circuit comprises a first transistor, the first transistor comprising:

a first emitter electrically coupled to the first power amplifier circuit, with the dynamic bias being output at the first emitter;

a first collector electrically coupled to a first power supply; and a first base electrically coupled to the second signal, wherein the bias circuit further comprises:

a first capacitor electrically connected between the first base of the first transistor and a ground;

a first resistor electrically connected between the first base of the first transistor and a second power supply;

a second transistor, comprising a second emitter electrically connected to the ground through a second resistor, a second collector electrically connected to the first base of the first transistor, and a second base electrically connected to the ground through a second capacitor;

a first diode electrically connected between the second base of the second transistor and the second signal;

a third resistor electrically connected in series with a fourth resistor at a first terminal of the third resistor and between the second power supply and a third collector of a third transistor, wherein the first diode is electrically connected between the second base of the second transistor and the first terminal of the third resistor; and the third transistor, comprising a third emitter electrically coupled to the first input signal, and a third base electrically connected to the ground via a third capacitor.

9. The circuit of claim 8, wherein the bias circuit is configured to generate the dynamic bias based on power of the first input signal.

10. The circuit of claim 8, wherein the dynamic bias is a current bias or a voltage bias.

11. The circuit of claim 8, wherein the bias circuit further comprises:

a fifth resistor, a second diode and a third diode connected in series, the fifth resistor including a second terminal connected to the second power supply and a third terminal connected to an anode of the second diode and to the third base of the third transistor; and the third diode including a cathode connected to the ground.

12. The circuit of claim 8, wherein the Doherty power amplifier circuit further comprises a second power amplifier circuit configured to operate in class AB, and wherein the first power amplifier circuit is configured to receive the first input signal and generate a first amplified signal of the first input signal, and the second power amplifier circuit is configured to receive the first input signal and generate a second amplified signal of the first input signal.

13. The circuit of claim 12, further comprising a combiner circuit configured to combine the first amplified signal of the first input signal and the second amplified signal of the first input signal to obtain the amplified signal of the first input signal.

14. A method comprising:

amplifying a first input signal by a Doherty power amplifier circuit, the Doherty power amplifier circuit comprising a first power amplifier circuit configured to operate in class C;

receiving, by a bias circuit external to and electrically coupled to the first power amplifier circuit, a control signal being derived from the first input signal; and generating, by the bias circuit, a dynamic bias to bias the first power amplifier circuit, the dynamic bias being adjustable based on the control signal;

wherein the bias circuit comprises a first transistor, the first transistor comprising:

a first emitter electrically coupled to the first power amplifier circuit, with the dynamic bias being output at the first emitter, a first collector electrically coupled to a first power supply, and a first base electrically coupled to the control signal; and wherein the bias circuit further comprises:

a first capacitor electrically connected between the first base of the first transistor and a ground, a first resistor electrically connected between the first base of the first transistor and a second power supply different from the first power supply, a second transistor, comprising a second emitter electrically connected to the ground through a second resistor, a second collector electrically connected to the first base of the first transistor, and a second base electrically connected to the ground through a second capacitor different from the first capacitor, and a first diode electrically connected between the second base of the second transistor and the control signal.

15. The method of claim 14, further comprising:

obtaining an amplified signal of the first input signal.

16. The method of claim 14, further comprising:

generating the control signal based on the first input signal.

* * * * *